(12) United States Patent
Miyake

(10) Patent No.: US 8,869,363 B2
(45) Date of Patent: Oct. 28, 2014

(54) METHOD OF MANUFACTURING STACKED THIN FILM PIEZOELECTRIC FILTER

(75) Inventor: Takashi Miyake, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 913 days.

(21) Appl. No.: 12/961,593

(22) Filed: Dec. 7, 2010

(65) Prior Publication Data

US 2011/0131774 A1    Jun. 9, 2011

(30) Foreign Application Priority Data

Dec. 8, 2009  (JP) .................................. 2009-278576
Oct. 21, 2010  (JP) .................................. 2010-236297

(51) Int. Cl.
| | | |
|---|---|---|
| H03H 3/04 | (2006.01) | |
| H01L 41/04 | (2006.01) | |
| H03H 9/58 | (2006.01) | |
| H01L 41/27 | (2013.01) | |
| H01L 41/083 | (2006.01) | |
| H03H 3/02 | (2006.01) | |

(52) U.S. Cl.
CPC ........... *H03H 3/04* (2013.01); *H03H 2003/025* (2013.01); *H03H 9/584* (2013.01); *H03H 9/588* (2013.01); *H03H 2003/0442* (2013.01); *H01L 41/27* (2013.01); *H03H 9/589* (2013.01); *H03H 3/02* (2013.01); *H01L 41/083* (2013.01); *H03H 2003/0421* (2013.01); *H03H 2003/0435* (2013.01); *H03H 2003/023* (2013.01); *H03H 2003/0428* (2013.01)
USPC ................ 29/25.35; 29/594; 29/593; 29/842; 29/846; 333/187

(58) Field of Classification Search
CPC ........... H03H 3/02; H03H 3/04; H03H 9/588; H03H 9/589; H03H 2003/023; H03H 2003/025; H03H 2003/0421; H03H 2003/0428; H03H 2003/0435; H03H 2003/0442; H01L 41/27; H01L 41/083
USPC ......... 29/25.35, 593, 594, 842, 846; 333/187, 333/189, 193
See application file for complete search history.

(56) References Cited

U.S. PATENT DOCUMENTS

| | | | |
|---|---|---|---|
| 6,720,844 B1 | 4/2004 | Lakin | |
| 6,917,261 B2 * | 7/2005 | Unterberger | .................. 333/189 |
| 2008/0309432 A1 * | 12/2008 | Fattinger et al. | ......... 29/25.35 X |

FOREIGN PATENT DOCUMENTS

| | | | |
|---|---|---|---|
| JP | 2001-24467 A | | 1/2001 |
| JP | 2007-166148 A | | 6/2007 |
| JP | 2007159123 A | * | 6/2007 |

* cited by examiner

*Primary Examiner* — A. Dexter Tugbang
(74) *Attorney, Agent, or Firm* — Keating & Bennett, LLP

(57) ABSTRACT

A method of manufacturing a stacked thin film piezoelectric filter includes the steps of forming a lower thin film piezoelectric resonator on a substrate, measuring a frequency of the lower thin film piezoelectric resonator and adjusting the frequency, forming an acoustic coupling layer on the lower thin film piezoelectric resonator whose frequency has been adjusted, forming the stacked thin film piezoelectric filter by forming an upper thin film piezoelectric resonator on the acoustic coupling layer, and measuring a frequency of the upper thin film piezoelectric resonator and adjusting the frequency.

11 Claims, 13 Drawing Sheets

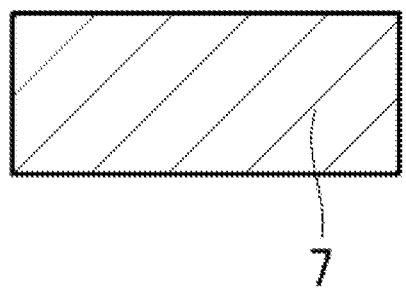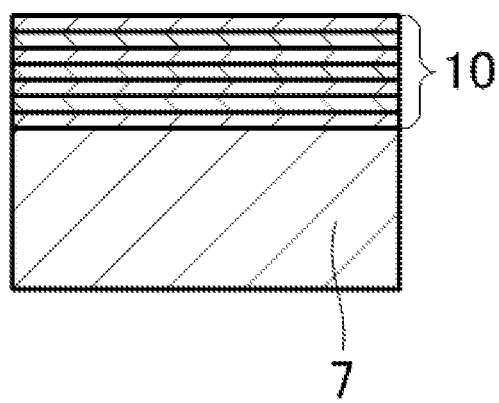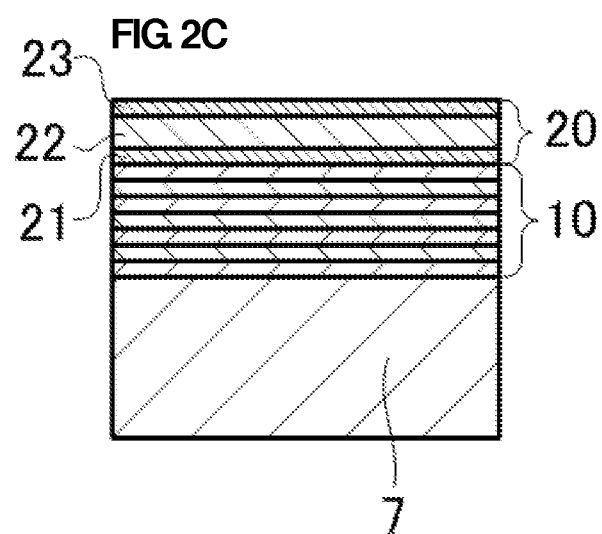

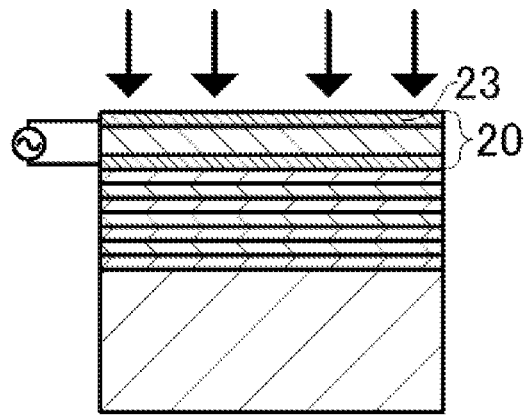
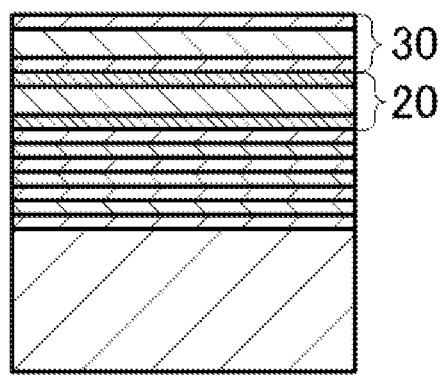
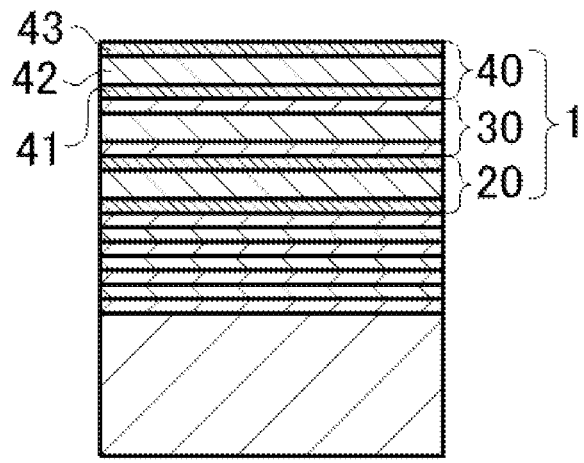

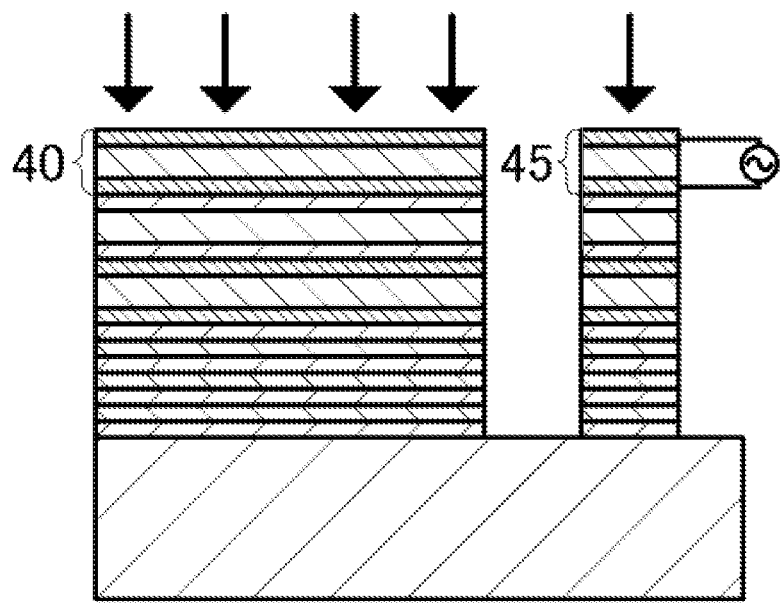

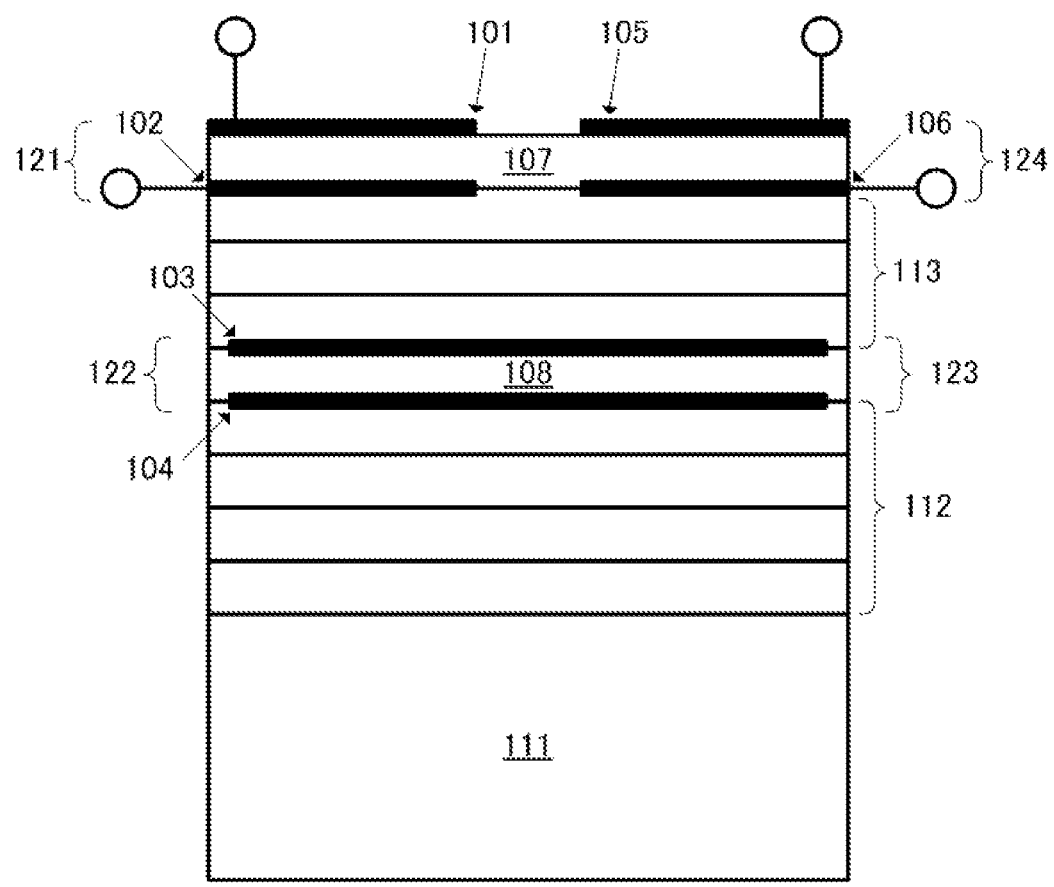

METHOD OF MANUFACTURING STACKED THIN FILM PIEZOELECTRIC FILTER

BACKGROUND OF THE INVENTION

1. Field of the Invention

The present invention relates to methods of manufacturing a stacked thin film piezoelectric filter including at least two thin film piezoelectric resonators.

2. Description of the Related Art

Inter-stage filters and duplexers are essential for the circuits of wireless communication apparatuses, such as cellular phones, for example. Hitherto, surface acoustic wave (SAW) filters and dielectric filters have been used for such applications. In recent years, thin film piezoelectric filters have been used for inter-stage filters and duplexers in accordance with requirements for a high withstand power, a low loss, and a reduced size. Further, in response to market requirements, thin film piezoelectric filters with a balanced-unbalanced conversion function that allows an unbalanced signal to be converted to a balanced signal have been developed. A method for providing a balanced-unbalanced conversion function in a thin film piezoelectric filter is to stack two resonators in the thickness direction thereof, and thereby couple the mechanical oscillation of the resonators to each other. The structure of such a vertical coupling thin film piezoelectric filter is disclosed in U.S. Pat. No. 6,720,844, for example.

Referring to FIG. 13, the stacked thin film piezoelectric filter of U.S. Pat. No. 6,720,844 includes thin film piezoelectric resonators 121, 122, 123, and 124. The thin film piezoelectric resonators 121 and 122 are acoustically coupled with each other through an acoustic coupling layer 113. The thin film piezoelectric resonators 122 and 123 are electrically connected to each other. The thin film piezoelectric resonators 123 and 124 are acoustically coupled with each other through the acoustic coupling layer 113. A signal input to the thin film piezoelectric resonator 121 is output to the thin film piezoelectric resonator 124 through the thin film piezoelectric resonators 122 and 123. The thin film piezoelectric resonators 122 and 123 are disposed on an acoustic reflection layer 112 that is disposed on a substrate 111.

A known method of adjusting the frequency of the stacked thin film piezoelectric filter of U.S. Pat. No. 6,720,844 is disclosed in Japanese Unexamined Patent Application Publication No. 2007-166148. This document discloses a method of adjusting the resonant frequency by adding a new layer on an upper electrode or by decreasing the thickness of the electrode through etching, for example.

However, when the method disclosed in Japanese Unexamined Patent Application Publication No. 2007-166148 is applied to the stacked thin film piezoelectric filter disclosed in U.S. Pat. No. 6,720,844, although the frequencies of the thin film piezoelectric resonators 121 and 124 can be adjusted, the frequencies of the thin film piezoelectric resonators 122 and 123 cannot be adjusted. Thus, the frequency of the thin film piezoelectric resonator 121 or 124 is different from the frequencies of the thin film piezoelectric resonators 122 and 123, thereby causing the frequency characteristics to be deteriorated.

SUMMARY OF THE INVENTION

To overcome the problems described above, preferred embodiments of the present invention provide a method of manufacturing a stacked thin film piezoelectric filter that experiences substantially no deterioration in frequency characteristics and that achieves accurate frequency adjustment.

A method of manufacturing a stacked thin film piezoelectric filter including a lower thin film piezoelectric resonator, an acoustic coupling layer formed on the lower thin film piezoelectric resonator, and an upper thin film piezoelectric resonator formed on the acoustic coupling layer, includes the steps of forming the lower thin film piezoelectric resonator on a substrate, measuring and adjusting a frequency of the lower thin film piezoelectric resonator, forming the acoustic coupling layer on the lower thin film piezoelectric resonator whose frequency has been adjusted, forming the upper thin film piezoelectric resonator on the acoustic coupling layer, and measuring and adjusting a frequency of the upper thin film piezoelectric resonator.

According to a preferred embodiment of the present invention, in the step of measuring and adjusting frequency of the upper thin film piezoelectric resonator, the frequency of the upper thin film piezoelectric resonator is preferably measured in advance and adjusted afterwards.

According to another preferred embodiment of the present invention, in the step of measuring and adjusting the frequency of the upper thin film piezoelectric resonator, the frequency of the upper thin film piezoelectric resonator is preferably adjusted while being measured.

According to another preferred embodiment of the present invention, in the step of measuring and adjusting the frequency of the upper thin film piezoelectric resonator, the frequency of the upper thin film piezoelectric resonator is preferably adjusted by increasing or decreasing a thickness of an electrode layer of the upper thin film piezoelectric resonator.

A method of manufacturing a stacked thin film piezoelectric filter including a lower thin film piezoelectric resonator, an acoustic coupling layer formed on the lower thin film piezoelectric resonator, and an upper thin film piezoelectric resonator formed on the acoustic coupling layer according to another preferred embodiment of the present invention includes the steps of forming the lower thin film piezoelectric resonator on a substrate, measuring and adjusting a frequency of the lower thin film piezoelectric resonator, forming the acoustic coupling layer on the lower thin film piezoelectric resonator whose frequency has been adjusted, forming the upper thin film piezoelectric resonator on the acoustic coupling layer, and measuring and adjusting a frequency of the stacked thin film piezoelectric filter.

According to another preferred embodiment of the present invention, in the step of measuring and adjusting the frequency of the stacked thin film piezoelectric filter, the frequency of the stacked thin film piezoelectric filter is preferably measured in advance and adjusted afterwards.

According to another preferred embodiment of the present invention, in the step of measuring and adjusting the frequency of the stacked thin film piezoelectric filter, the frequency of the stacked thin film piezoelectric filter is preferably adjusted while being measured.

According to another preferred embodiment of the present invention, in the step of measuring and adjusting the frequency of the stacked thin film piezoelectric filter, the frequency of the stacked thin film piezoelectric filter is preferably adjusted by increasing or decreasing a thickness of an electrode layer of the upper thin film piezoelectric resonator.

According to another preferred embodiment of the present invention, in the step of measuring and adjusting the frequency of the lower thin film piezoelectric resonator, the frequency of the lower thin film piezoelectric resonator is preferably measured in advance and adjusted afterwards.

According to another preferred embodiment of the present invention, in the step of measuring and adjusting the frequency of the lower thin film piezoelectric resonator, the frequency of the lower thin film piezoelectric resonator is preferably adjusted while being measured.

In the various preferred embodiments of the present invention, the frequency of the stacked thin film piezoelectric filter can be accurately adjusted by adjusting the frequency of the lower thin film piezoelectric resonator in advance.

According to a preferred embodiment of the present invention, in the step of measuring and adjusting the frequency of the lower thin film piezoelectric resonator, the frequency is preferably adjusted by increasing or decreasing a thickness of an electrode layer of the lower thin film piezoelectric resonator.

In this case, the frequency can be adjusted by increasing or decreasing the thickness of the electrode layer without adding a new layer.

According to another preferred embodiment of the present invention, in the step of measuring and adjusting the frequency of the lower thin film piezoelectric resonator, an adjustment layer is preferably provided on the lower thin film piezoelectric resonator, and the frequency is preferably adjusted by increasing or decreasing a thickness of the adjustment layer.

In this case, the frequency can be accurately adjusted by providing the adjustment layer.

According to another preferred embodiment of the present invention, in the step of forming of the acoustic coupling layer, the frequency of the lower thin film piezoelectric resonator is preferably adjusted by increasing or decreasing a thickness of the acoustic coupling layer.

In this case, the frequency can be adjusted by increasing or decreasing the thickness of the acoustic coupling layer without adding a new layer.

A method of manufacturing a stacked thin film piezoelectric filter including a lower thin film piezoelectric resonator, an acoustic coupling layer formed on the lower thin film piezoelectric resonator, and an upper thin film piezoelectric resonator formed on the acoustic coupling layer according to a preferred embodiment of the present invention includes the steps of forming the lower thin film piezoelectric resonator and a lower test thin film piezoelectric resonator on a substrate, measuring and adjusting frequencies of the lower thin film piezoelectric resonator and the lower test thin film piezoelectric resonator by measuring the frequency of the lower test thin film piezoelectric resonator, forming the acoustic coupling layer and a test acoustic coupling layer respectively on the lower thin film piezoelectric resonator and the lower test thin film piezoelectric resonator whose frequencies have been adjusted, forming the stacked thin film piezoelectric filter and a test stacked thin film piezoelectric filter by forming the upper thin film piezoelectric resonator and an upper test thin film piezoelectric resonator respectively on the acoustic coupling layer and the test acoustic coupling layer, and measuring and adjusting frequencies of the upper thin film piezoelectric resonator and the upper test thin film piezoelectric resonator by measuring the frequency of the upper test thin film piezoelectric resonator.

A method of manufacturing a stacked thin film piezoelectric filter including a lower thin film piezoelectric resonator, an acoustic coupling layer formed on the lower thin film piezoelectric resonator, and an upper thin film piezoelectric resonator formed on the acoustic coupling layer according to another preferred embodiment of the present invention includes the steps of forming the lower thin film piezoelectric resonator and a lower test thin film piezoelectric resonator on a substrate, measuring and adjusting frequencies of the lower thin film piezoelectric resonator and the lower test thin film piezoelectric resonator by measuring the frequency of the lower test thin film piezoelectric resonator, and forming the acoustic coupling layer and a test acoustic coupling layer respectively on the lower thin film piezoelectric resonator and the lower test thin film piezoelectric resonator whose frequencies have been adjusted, forming the stacked thin film piezoelectric filter and a test stacked thin film piezoelectric filter by forming the upper thin film piezoelectric resonator and an upper test thin film piezoelectric resonator respectively on the acoustic coupling layer and the test acoustic coupling layer, and measuring and adjusting frequencies of the stacked thin film piezoelectric filter and the test stacked thin film piezoelectric filter by measuring the frequency of the test stacked thin film piezoelectric filter.

According to a preferred embodiment of the present invention, a layer thickness of the lower test thin film piezoelectric resonator or the upper test thin film piezoelectric resonator is preferably measured and the frequency of the lower thin film piezoelectric resonator, the upper thin film piezoelectric resonator, or the stacked thin film piezoelectric filter is preferably adjusted based on the measured layer thickness.

In this case, the accuracy of adjusting the frequency is improved.

The frequency of the stacked thin film piezoelectric filter can be accurately adjusted by adjusting the frequency of the lower thin film piezoelectric resonator in advance.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2C are sectional views illustrating a method of manufacturing a stacked thin film piezoelectric filter according to a first preferred embodiment of the present invention.

FIGS. 3D to 3F are sectional views illustrating the method of manufacturing the stacked thin film piezoelectric filter according to the first preferred embodiment of the present invention.

FIG. 10G is a sectional view illustrating the method of manufacturing the stacked thin film piezoelectric filter according to the fifth preferred embodiment of the present invention.

FIG. 13 is a sectional view of an existing stacked thin film piezoelectric filter.

DETAILED DESCRIPTION OF THE PREFERRED EMBODIMENTS

Hereinafter, preferred embodiments of the present invention will be described with reference to the drawings.

First Preferred Embodiment

Figure 1A:
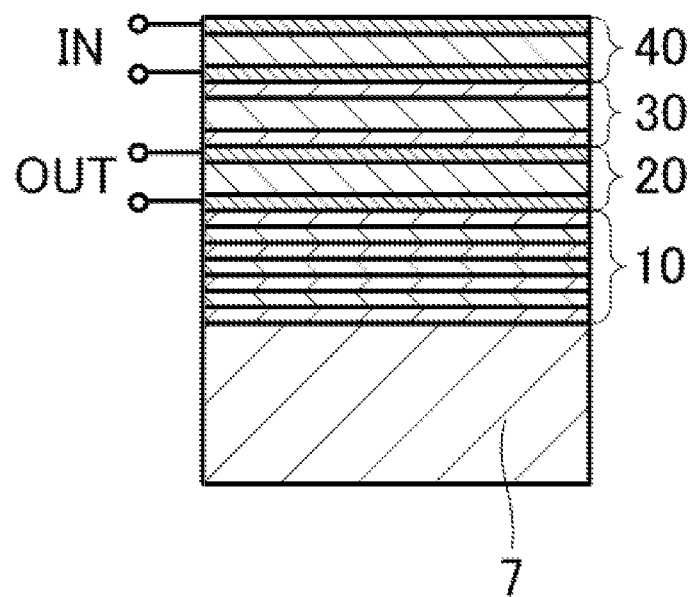
FIGS. 1A and 1B are sectional views of a stacked thin film piezoelectric filter.
Figure 1B:
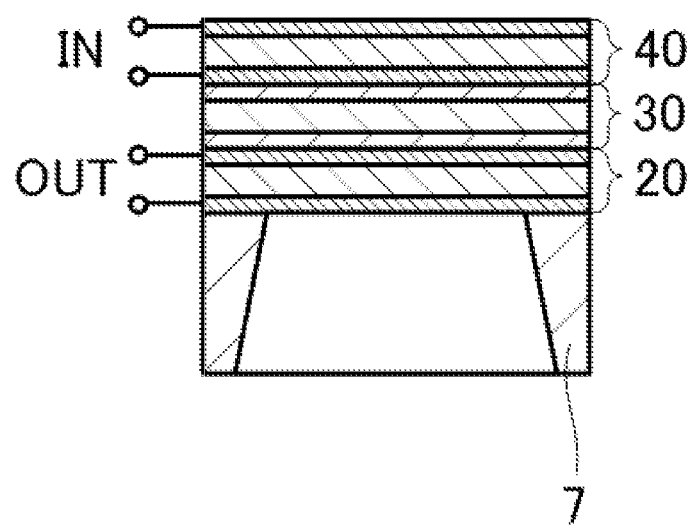

FIGS. 1A and 1B are sectional views of a stacked thin film piezoelectric filter manufactured according to a manufacturing method according to a first preferred embodiment of the present invention.

A stacked thin film piezoelectric filter includes a lower thin film piezoelectric resonator 20, an acoustic coupling layer 30, and an upper thin film piezoelectric resonator 40. The stacked thin film piezoelectric filter is formed on a substrate 7. FIG. 1A illustrates a structure in which an acoustic reflection layer 10 is formed on the substrate 7. FIG. 1B illustrates a structure in which a space, instead of the acoustic reflection layer 10, is provided below the lower thin film piezoelectric resonator 20.

The acoustic coupling layer 30 is formed on the lower thin film piezoelectric resonator 20. The upper thin film piezoelectric resonator 40 is formed on the acoustic coupling layer 30. The thin films of the stacked thin film piezoelectric filter are preferably formed by sputtering or other suitable method, for example.

The upper thin film piezoelectric resonator 40 is acoustically coupled with the lower thin film piezoelectric resonator 20 through the acoustic coupling layer 30. A signal input to the upper thin film piezoelectric resonator 40 is output to the lower thin film piezoelectric resonator 20 through the acoustic coupling layer 30.

The stacked thin film piezoelectric filter illustrated in FIG. 1A can preferably be manufactured using, for example, process steps illustrated in FIGS. 2A to 2C, FIGS. 3D to 3F, and FIG. 4G.

First, referring to FIG. 2A, the substrate 7 is prepared. Examples of materials used for the substrate 7 preferably include Si.

Then, the acoustic reflection layer 10 is formed on the substrate 7 as illustrated in FIG. 2B. The acoustic reflection layer 10, which preferably has a stacked structure, functions to acoustically separate the stacked thin film piezoelectric filter from the substrate 7.

Then, referring to FIG. 2C, the lower thin film piezoelectric resonator 20 is formed on the acoustic reflection layer 10, above the substrate 7. The lower thin film piezoelectric resonator 20 includes electrode layers 21 and 23 and a lower piezoelectric layer 22. The lower piezoelectric layer 22 is sandwiched between the electrode layers 21 and 23.

Then, referring to FIG. 3D, the frequency of the lower thin film piezoelectric resonator 20 is measured and adjusted. In more detail, the frequency is preferably adjusted, for example, by increasing or decreasing the thickness of the electrode layer of the lower thin film piezoelectric resonator 20. FIG. 3D illustrates an example in which the thickness of the upper electrode layer 23 of the lower thin film piezoelectric resonator 20 is increased or decreased. In this case, the frequency can be adjusted without forming a new film. The frequency tends to decrease as the layer thickness increases, and the frequency tends to increase as the layer thickness decreases. The same method as that used to form the layer may preferably be used to increase the layer thickness. Ion beam etching or reactive ion etching, for example, may preferably be used as a method of decreasing the layer thickness.

The step of "measuring and adjusting the frequency" includes a step in which the frequency of the lower thin film piezoelectric resonator 20 is measured in advance and the frequency is adjusted afterwards and a step in which the frequency of the lower thin film piezoelectric resonator 20 is adjusted while being measured. In the former case, the correlation between the frequency and the thickness of the electrode layer is preferably studied in advance by increasing or decreasing the layer thickness, for example. Then, after measuring the frequency of the lower thin film piezoelectric resonator 20, the thickness of the electrode layer is increased or decreased so as to compensate for the difference between the current frequency and the target frequency. In this case, once the frequency has been measured a single time, the frequency can be set to be the same or substantially the same as the target frequency, without further measurement of the frequency, simply by increasing or decreasing the thickness of the electrode layer. In the latter case, the thickness of the electrode layer is increased or decreased such that the frequency approaches the target frequency by monitoring the frequency being measured. The frequency is measured after every increase or decrease of the thickness of the electrode layer. By repeating this process, the frequency of the lower thin film piezoelectric resonator 20 is set to be the same or substantially the same as the target frequency.

Then, referring to FIG. 3E, the acoustic coupling layer 30 is formed on the lower thin film piezoelectric resonator 20, whose frequency has been adjusted. An insulator film made of, for example, $SiO_2$, $SiNx$, $ZnO$, $AlN$, $Al_2O_3$, or a polyimide resin is preferably used for the acoustic coupling layer 30. The acoustic coupling layer 30 preferably includes a plurality of layers having different acoustic impedances that are stacked to optimize the mode intervals in the resonance mode of the stacked thin film piezoelectric filter.

Then, referring to FIG. 3F, the upper thin film piezoelectric resonator 40 is formed on the acoustic coupling layer 30, thereby forming a stacked thin film piezoelectric filter 1 including the lower thin film piezoelectric resonator 20, the acoustic coupling layer 30, and the upper thin film piezoelectric resonator 40. The upper thin film piezoelectric resonator 40 preferably includes electrode layers 41 and 43 and an upper piezoelectric layer 42. The upper piezoelectric layer 42 is sandwiched between the electrode layers 41 and 43. Examples of materials used for the upper piezoelectric layer 42 and the lower piezoelectric layer 22 preferably include AlN, ZnO, $LiNbO_3$, $LiTaO_3$, a crystal, and lead zirconate titanate. Examples of materials used for the electrode layers preferably include Al, Cu, Ag, Au, Mo, Ru, Ir, Ti, Ni, and Cr. A laminate or alloys of these materials may also preferably be used.

Figure 4G:
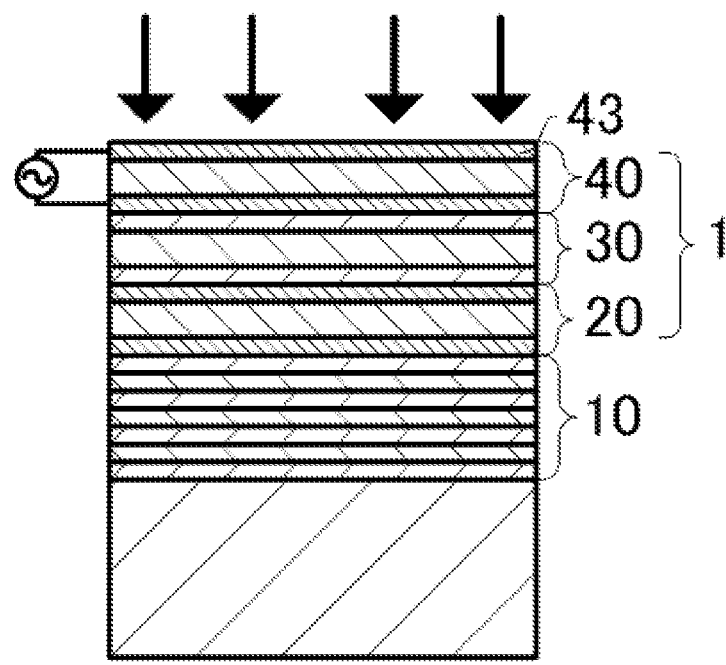
FIG. 4G is a sectional view illustrating the method of manufacturing the stacked thin film piezoelectric filter according to the first preferred embodiment of the present invention.

Then, referring to FIG. 4G, the frequency of the upper thin film piezoelectric resonator 40 is measured and adjusted. For example, the frequency is preferably adjusted by increasing or decreasing the thickness of the electrode layer of the upper thin film piezoelectric resonator 40. FIG. 4G illustrates an example in which the thickness of the upper electrode layer 43 of the upper thin film piezoelectric resonator 40 is increased or decreased.

Similarly to the lower thin film piezoelectric resonator 20, the step of "measuring and adjusting the frequency" preferably includes a step in which the frequency of the upper thin film piezoelectric resonator 40 or the stacked thin film piezoelectric filter is measured in advance and adjusted afterwards and a step in which the frequency of the upper thin film piezoelectric resonator 40 or the stacked thin film piezoelectric filter is adjusted while being measured.

Second Preferred Embodiment

In a second preferred embodiment of the present invention, instead of measuring and adjusting the frequency of the upper electrode resonator as in the first preferred embodiment, the frequency of the stacked thin film piezoelectric filter is preferably measured and adjusted.

First, as illustrated in FIGS. 2A to 2C and FIGS. 3D to 3F, the stacked thin film piezoelectric filter 1 including the lower thin film piezoelectric resonator 20, the acoustic coupling layer 30, and the upper thin film piezoelectric resonator 40 is formed.

Figure 5:
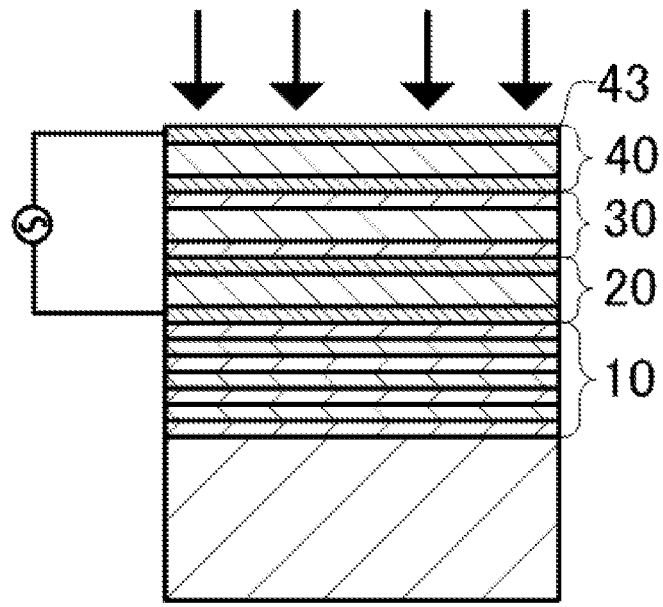
FIG. 5 is a sectional view illustrating a method of manufacturing a stacked thin film piezoelectric filter according to a second preferred embodiment of the present invention.

Then, as illustrated in FIG. 5, the frequency of the stacked thin film piezoelectric filter 1 is measured and adjusted. In this case, since the frequency of the stacked thin film piezoelectric filter 1 can be directly measured, it is not necessary to study the correlation between the frequency of the upper thin film piezoelectric resonator 40 and the frequency of the stacked thin film piezoelectric filter 1 in advance.

Third Preferred Embodiment

Figure 6:
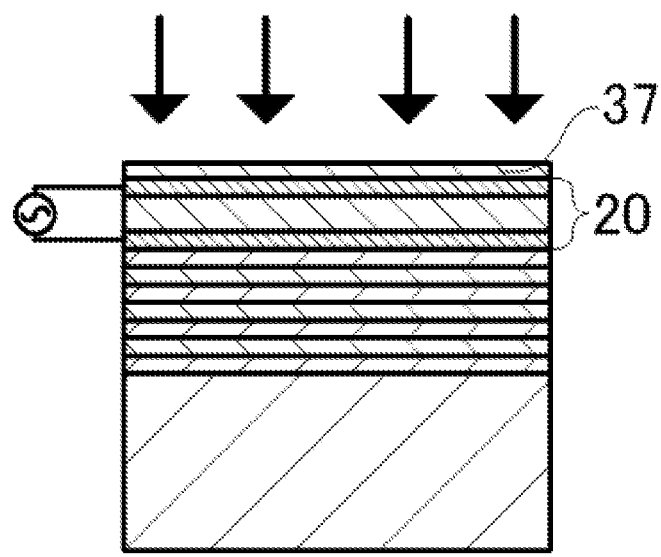
FIG. 6 is a sectional view illustrating a method of manufacturing a stacked thin film piezoelectric filter according to a third preferred embodiment of the present invention.

FIG. 6 illustrates a third preferred embodiment of the present invention in which, in the process step of measuring and adjusting the frequency of the lower thin film piezoelectric resonator, an adjustment layer 37 is preferably provided on the lower thin film piezoelectric resonator 20, and the frequency is adjusted by increasing or decreasing the thickness of the adjustment layer 37. When the adjustment layer is provided, accurate adjustment of the frequency is possible.

Fourth Preferred Embodiment

Figure 7:
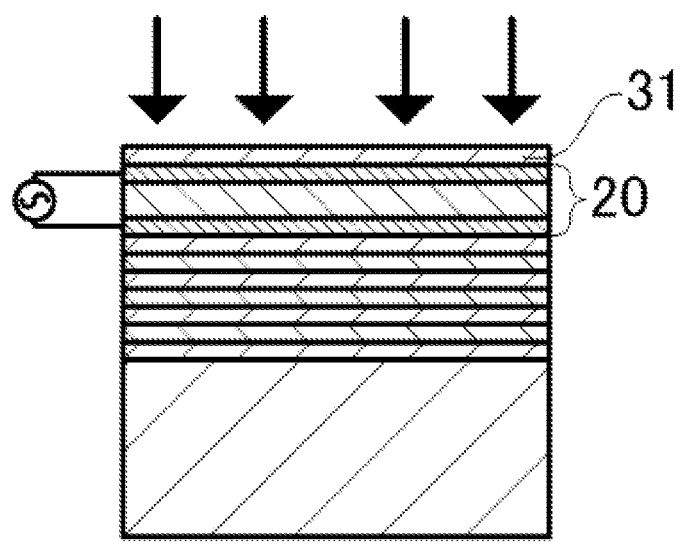
FIG. 7 is a sectional view illustrating a method of manufacturing a stacked thin film piezoelectric filter according to a fourth preferred embodiment of the present invention.

FIG. 7 illustrates a fourth preferred embodiment of the present invention in which, in the process step of forming the acoustic coupling layer, the frequency of the lower thin film piezoelectric resonator 20 is preferably adjusted by increasing or decreasing the thickness of the acoustic coupling layer. As illustrated in FIG. 7, after a portion of the acoustic coupling layer has been formed, the frequency of the lower thin film piezoelectric resonator 20 may preferably be adjusted by increasing or decreasing the thickness of an acoustic coupling layer 31. In this case, it is not necessary to form a new layer in order to adjust the frequency. Note that the thickness of the acoustic coupling layer may be increased or decreased after the entire acoustic coupling layer has been formed.

Fifth Preferred Embodiment

In a fifth preferred embodiment of the present invention, a test stacked thin film piezoelectric filter is formed and the frequencies of the lower thin film piezoelectric resonator and the acoustic coupling layer are preferably adjusted by measuring the frequencies of a lower test thin film piezoelectric resonator and an upper test thin film piezoelectric resonator.

Figure 8A:
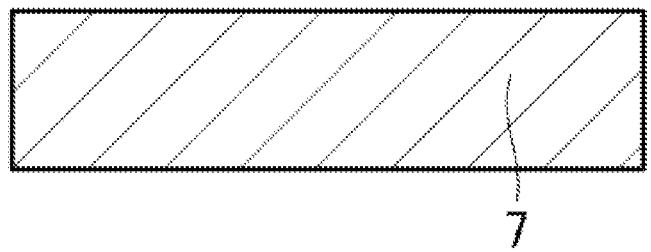
FIGS. 8A to 8C are sectional views illustrating a method of manufacturing a stacked thin film piezoelectric filter according to a fifth preferred embodiment of the present invention.

First, a substrate 7 is prepared as illustrated in FIG. 8A.

Figure 8B:
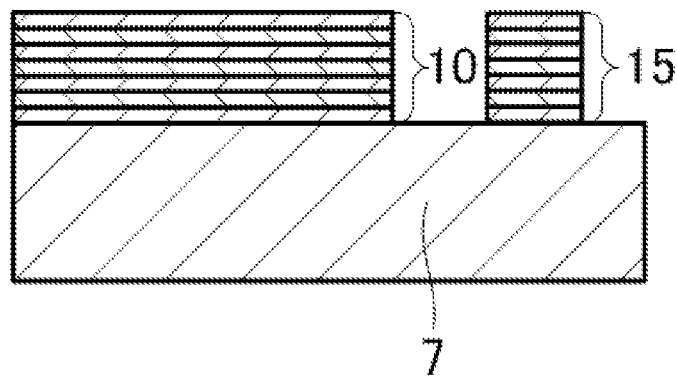

Then, referring to FIG. 8B, an acoustic reflection layer 10 and a test acoustic reflection layer 15 are formed on the substrate 7. The material and thickness of the test acoustic reflection layer 15 are the same or substantially the same as those of the acoustic reflection layer 10. The acoustic reflection layer 10 and the test acoustic reflection layer 15 are preferably formed at the same time, for example.

Figure 8C:
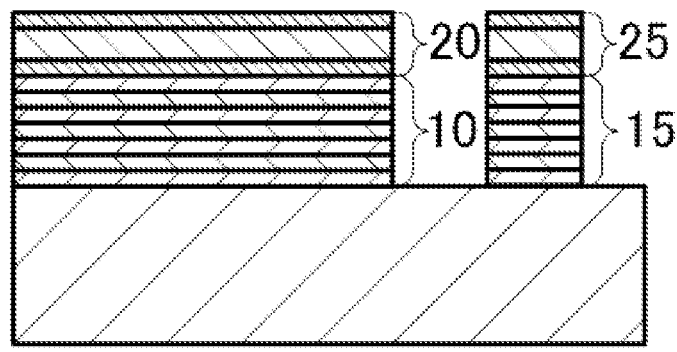

Then, referring to FIG. 8C, a lower thin film piezoelectric resonator 20 and a lower test thin film piezoelectric resonator 25 are respectively formed on the acoustic reflection layer 10 and the test acoustic reflection layer 15 on the substrate 7. The material and thickness of the lower test thin film piezoelectric resonator 25 preferably are the same or substantially the same as those of the lower thin film piezoelectric resonator 20, for example. The lower test thin film piezoelectric resonator 25 and the lower thin film piezoelectric resonator 20 are preferably formed at the same time, for example.

Figure 9D:
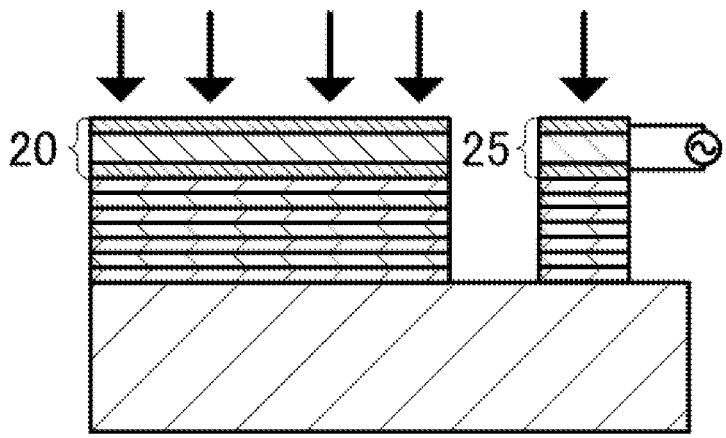
FIGS. 9D to 9F are sectional views illustrating the method of manufacturing the stacked thin film piezoelectric filter according to the fifth preferred embodiment of the present invention.

Then, referring to FIG. 9D, the frequencies of the lower thin film piezoelectric resonator 20 and the lower test thin film piezoelectric resonator 25 are preferably adjusted by measuring the frequency of the lower test thin film piezoelectric resonator 25. In this case, the frequencies may be adjusted after the frequency of the lower test thin film piezoelectric resonator 25 has been measured in advance, or while the frequency of the lower test thin film piezoelectric resonator 25 is being measured.

Figure 9E:
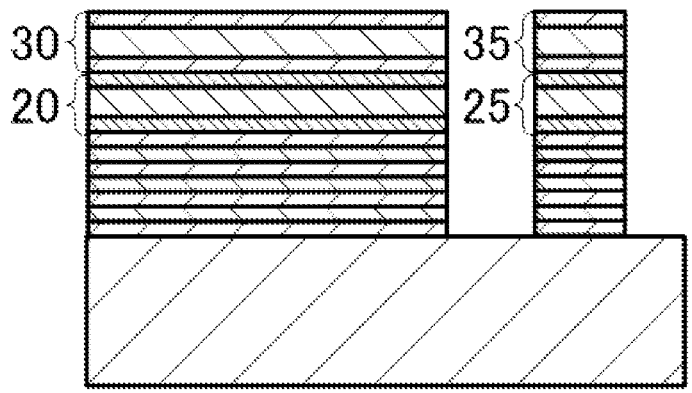

Then, referring to FIG. 9E, an acoustic coupling layer and a test acoustic coupling layer 35 are preferably respectively formed on the lower thin film piezoelectric resonator 20 and the lower test thin film piezoelectric resonator 25, whose frequencies have been adjusted. The material and thickness of the test acoustic coupling layer 35 preferably are the same or substantially the same as those of the acoustic coupling layer 30, for example. The acoustic coupling layer 30 and the test acoustic coupling layer 35 are preferably formed at the same time, for example.

Figure 9F:
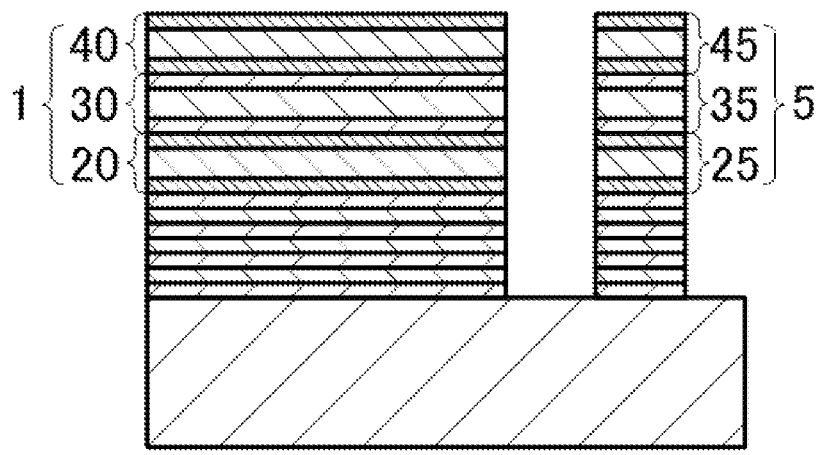

Then, referring to FIG. 9F, an upper thin film piezoelectric resonator 40 and an upper test thin film piezoelectric resonator 45 are preferably respectively formed on the acoustic coupling layer 30 and the test acoustic coupling layer 35, whereby a stacked thin film piezoelectric filter 1 and a test stacked thin film piezoelectric filter 5 are formed. The stacked thin film piezoelectric filter 1 includes the lower thin film piezoelectric resonator 20, the acoustic coupling layer 30, and the upper thin film piezoelectric resonator 40. The test stacked thin film piezoelectric filter 5 includes the lower test thin film piezoelectric resonator 25, the test acoustic coupling layer 35, and the upper test thin film piezoelectric resonator 45. The material and thickness of the upper test thin film piezoelectric resonator 45 preferably are the same or substantially the same as those of the upper thin film piezoelectric resonator 40, for example. The upper thin film piezoelectric resonator 40 and the upper test thin film piezoelectric resonator 45 are preferably formed at the same time, for example.

Then, referring to FIG. 10G, the frequencies of the upper thin film piezoelectric resonator 40 and the upper test thin film piezoelectric resonator 45 are preferably adjusted by measuring the frequency of the upper test thin film piezoelectric resonator 45.

In the fifth preferred embodiment, the test stacked thin film piezoelectric filter 5 and the stacked thin film piezoelectric filter 1 are preferably formed on the same substrate. Thus, when a plurality of the stacked thin film piezoelectric filters are formed on the same substrate, the plurality of the stacked thin film piezoelectric filters can be formed at the same time by measuring the frequencies of the lower test thin film piezoelectric resonator and the upper test thin film piezoelectric resonator.

Sixth Preferred Embodiment

In a sixth preferred embodiment of the present invention, instead of adjusting the frequencies by measuring the upper test thin film piezoelectric resonator as in the fifth preferred embodiment, the frequencies of the stacked thin film piezoelectric filter and the test stacked thin film piezoelectric filter are preferably adjusted by measuring the test stacked thin film piezoelectric filter.

First, referring to FIGS. 8A to 8C and FIGS. 9D to 9F, the stacked thin film piezoelectric filter 1 and the test stacked thin film piezoelectric filter 5 are formed.

Figure 11:
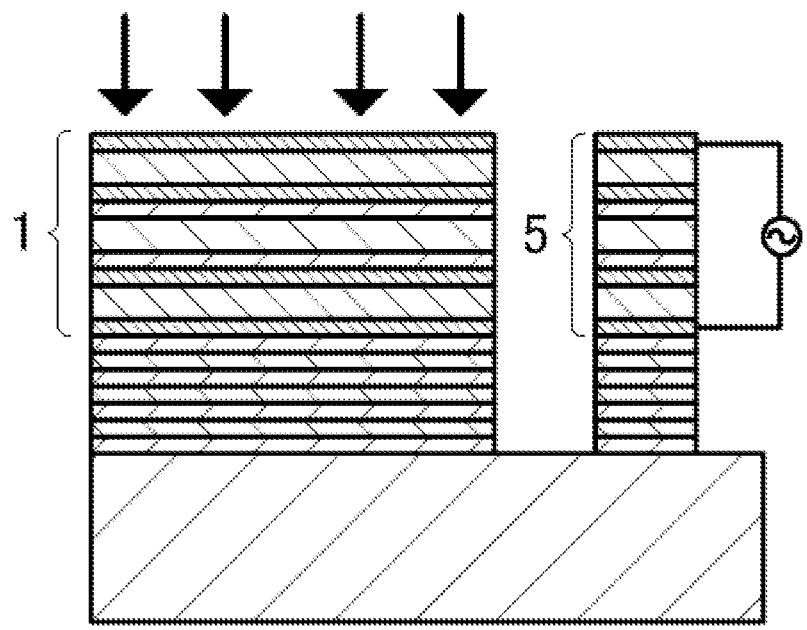
FIG. 11 is a sectional view illustrating a method of manufacturing a stacked thin film piezoelectric filter according to a sixth preferred embodiment of the present invention.

Then, referring to FIG. 11, the frequencies of the stacked thin film piezoelectric filter 1 and the test stacked thin film piezoelectric filter 5 are adjusted by measuring the frequency of the test stacked thin film piezoelectric filter 5.

Note that by measuring the thickness of the upper test thin film piezoelectric resonator or the lower test thin film piezoelectric resonator, the frequency of the lower thin film piezoelectric resonator, the upper thin film piezoelectric resonator, or the stacked thin film piezoelectric filter may be accurately adjusted. In this case, the correlation between the thickness of the upper test thin film piezoelectric resonator or the lower test thin film piezoelectric resonator and the frequency of the lower thin film piezoelectric resonator, the upper thin film piezoelectric resonator, or the stacked thin film piezoelectric filter is preferably studied in advance. The frequency of the lower thin film piezoelectric resonator, the upper thin film piezoelectric resonator, or the stacked thin film piezoelectric filter is adjusted by measuring both the frequency and the layer thickness. The use of this method improves the accuracy of the frequency adjustment.

In the first to sixth preferred embodiments, the stacked thin film piezoelectric filter preferably includes two thin film piezoelectric resonators, in which a piezoelectric layer is sandwiched between electrode layers. However, three or more of the thin film piezoelectric resonators may preferably be provided, for example. In this case, the frequency of each of the thin film piezoelectric resonators can be adjusted.

In the first to sixth preferred embodiments, the acoustic reflection layer 10 is preferably provided. However, preferred embodiments of the present invention can be also applied to a case in which a space is provided below the lower thin film piezoelectric resonator 20, as illustrated in FIG. 1B, for example.

Figure 12A:
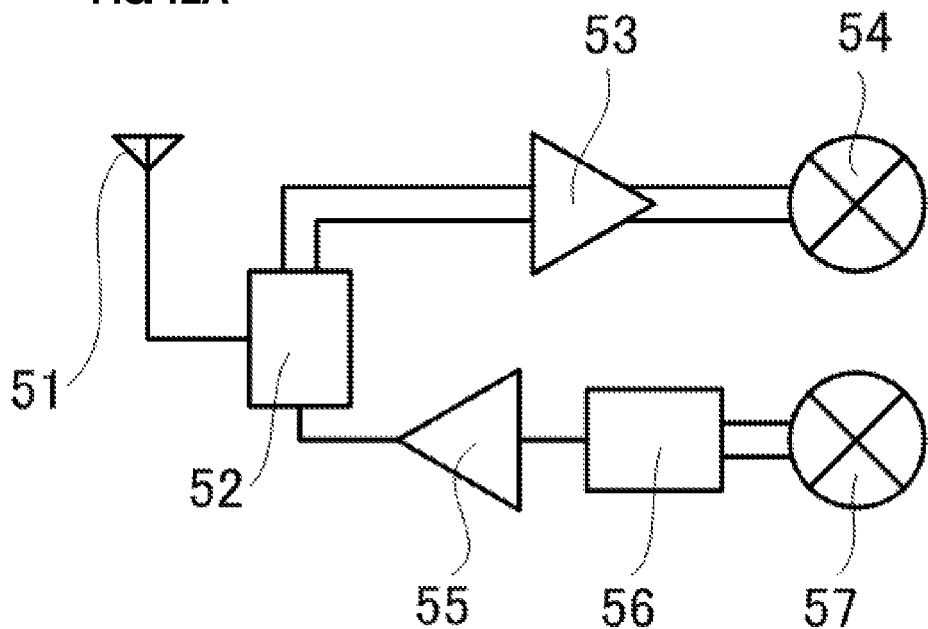
FIGS. 12A and 12B illustrate exemplary electric circuits in which the stacked thin film piezoelectric filter according to a preferred embodiment of the present invention is used.
Figure 12B:
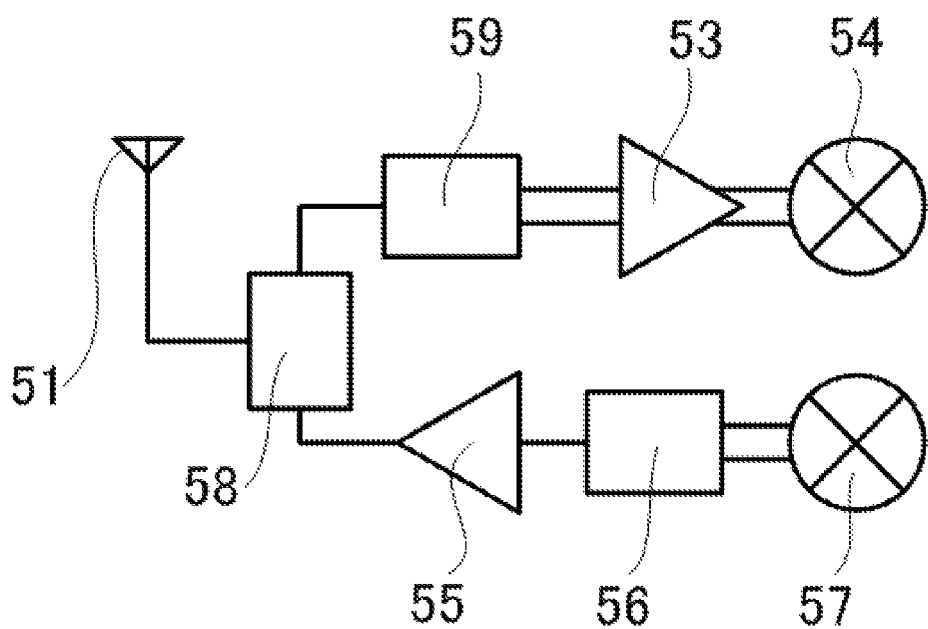

FIGS. 12A and 12B illustrate electric circuits in which the stacked thin film piezoelectric filter manufactured using the methods of manufacturing according to the first to sixth preferred embodiments is included.

FIG. 12A illustrates an example in which the stacked thin film piezoelectric filter is preferably included in a balanced duplexer 52. An unbalanced signal received by an antenna 51 is converted to a balanced signal by passing through the balanced duplexer 52, and is input to a receiver amplifier 53. At this time the balanced duplexer 52 removes an unnecessary signal. The balanced duplexer 52 has a balanced-unbalanced conversion function which converts an unbalanced signal to a balanced signal. The signal amplified by the receiver amplifier 53 is output to a receiver mixer 54. On the other hand, a signal from a transmitter mixer 57 is input to the balanced duplexer 52 through a transmitter filter 56 and a transmitter amplifier 55, and then output to the antenna 51.

FIG. 12B illustrates another example in which the stacked thin film piezoelectric filter is preferably included in a receiver balanced filter 59. A signal received by the antenna 51 is input to a receiver balanced filter 59 through a duplexer 58, where the signal is converted to a balanced signal and an unnecessary signal is removed, and is output to a receiver amplifier 53.

The following example of a stacked thin film piezoelectric filter was produced.

First, a substrate made of Si having a thickness of about 300 μm was prepared.

Then, an acoustic reflection layer was formed on the substrate. The acoustic reflection layer had seven layers, including four $SiO_2$ layers and three ZnO layers that were alternately stacked. The thickness of the $SiO_2$ layer was set to be about 0.82 μm. The thickness of the ZnO layer was set to be about 0.92 μm.

Then, a lower thin film piezoelectric resonator was formed on the acoustic reflection layer. Specifically, a Ti layer having a thickness of about 0.01 μm and a Pt layer having a thickness of about 0.11 μm were formed on the acoustic reflection layer as an electrode layer. On this layer, a ZnO layer having a thickness of about 0.75 μm was formed as a lower thin film piezoelectric layer. On this layer, a Ti layer having a thickness of about 0.01 μm and a Pt layer having a thickness of about 0.17 μm were formed as an electrode layer.

Then, an acoustic coupling layer was formed on the lower thin film piezoelectric resonator. Specifically, two $SiO_2$ layers and one ZnO layer were alternately stacked. The thickness of the $SiO_2$ layer was set to be about 0.99 μm and the thickness of the ZnO layer was set to be about 0.82 μm.

An upper thin film piezoelectric resonator was formed on the acoustic coupling layer. Specifically, a Ti layer having a thickness of about 0.01 μm and a Pt layer having a thickness of about 0.17 μm were formed as an electrode layer. On this layer, a ZnO layer having a thickness of about 0.75 μm was formed as an upper thin film piezoelectric layer. On this layer, a Ti layer having a thickness of about 0.01 μm and a Pt layer having a thickness of about 0.11 μm were formed as an electrode layer.

In the stacked thin film piezoelectric filter having this configuration, the resonant frequency or the anti-resonant frequency of the lower thin film piezoelectric resonator is adjusted in advance after the lower thin film piezoelectric resonator has been formed. Then, after the upper thin film piezoelectric resonator has been formed, the frequency of the upper thin film piezoelectric resonator or the central frequency of the stacked thin film piezoelectric filter is adjusted. Such an adjusting method allows the central frequency of the stacked thin film piezoelectric filter to be adjusted with high accuracy.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a stacked thin film piezoelectric filter including a lower thin film piezoelectric resonator, an acoustic coupling layer formed on the lower thin film piezoelectric resonator, and an upper thin film piezoelectric resonator formed on the acoustic coupling layer, the method comprising the steps of:

forming the lower thin film piezoelectric resonator on a substrate;

measuring and adjusting a frequency of the lower thin film piezoelectric resonator;

forming the acoustic coupling layer on the lower thin film piezoelectric resonator where the frequency of the lower thin film piezoelectric resonator has been adjusted;

forming the upper thin film piezoelectric resonator on the acoustic coupling layer; and measuring and adjusting a frequency of the upper thin film piezoelectric resonator.

2. The method of manufacturing the stacked thin film piezoelectric filter according to claim 1, wherein in the step of measuring and adjusting the frequency of the upper thin film piezoelectric resonator, the frequency of the upper thin film piezoelectric resonator is measured in advance and adjusted after being measured in advance.

3. The method of manufacturing the stacked thin film piezoelectric filter according to claim 1, wherein in the step of measuring and adjusting the frequency of the upper thin film piezoelectric resonator, the frequency of the upper thin film piezoelectric resonator is adjusted while being measured.

4. The method of manufacturing the stacked thin film piezoelectric filter according to claim 1, wherein in the step of measuring and adjusting the frequency of the upper thin film piezoelectric resonator, the frequency of the upper thin film piezoelectric resonator is adjusted by increasing or decreasing a thickness of an electrode layer of the upper thin film piezoelectric resonator.

5. The method of manufacturing the stacked thin film piezoelectric filter according to claim 1, wherein in the step of measuring and adjusting the frequency of the lower thin film piezoelectric resonator, the frequency of the lower thin film piezoelectric resonator is measured in advance and adjusted after being measured in advance.

6. The method of manufacturing the stacked thin film piezoelectric filter according to claim 1, wherein in the step of measuring and adjusting the frequency of the lower thin film piezoelectric resonator, the frequency of the lower thin film piezoelectric resonator is adjusted while being measured.

7. The method of manufacturing the stacked thin film piezoelectric filter according to claim 1, wherein in the step of measuring and adjusting the frequency of the lower thin film piezoelectric resonator, the frequency is adjusted by increasing or decreasing a thickness of an electrode layer of the lower thin film piezoelectric resonator.

8. The method of manufacturing the stacked thin film piezoelectric filter according to claim 1, wherein in the step of measuring and adjusting the frequency of the lower thin film piezoelectric resonator, an adjustment layer is provided on the lower thin film piezoelectric resonator, and the frequency is adjusted by increasing or decreasing a thickness of the adjustment layer.

9. The method of manufacturing the stacked thin film piezoelectric filter according to claim 1, wherein in the step of forming the acoustic coupling layer, the frequency of the lower thin film piezoelectric resonator is adjusted by increasing or decreasing a thickness of the acoustic coupling layer.

10. The method of manufacturing the stacked thin film piezoelectric filter according to claim 1, wherein the frequency of the upper thin film piezoelectric resonator or the lower thin film piezoelectric resonator is adjusted by measuring a frequency of a test pattern formed on the substrate on which the lower thin film piezoelectric resonator is formed.

11. The method of manufacturing the stacked thin film piezoelectric filter according to claim 10, wherein a layer thickness of the test pattern is measured at a time of adjusting the frequency of the upper thin film piezoelectric resonator or the lower thin film piezoelectric resonator, and the frequency of the upper thin film piezoelectric resonator or the lower thin film piezoelectric resonator is adjusted with reference to the layer thickness of the test pattern.

* * * * *